United States Patent
Martin

(10) Patent No.: US 7,126,520 B2
(45) Date of Patent: Oct. 24, 2006

(54) SEGMENTED SAWTOOTH GENERATOR

(75) Inventor: Robert T. Martin, Cupertino, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 37 days.

(21) Appl. No.: 10/769,270

(22) Filed: Jan. 30, 2004

(65) Prior Publication Data

US 2005/0168177 A1    Aug. 4, 2005

(51) Int. Cl.
*H03M 1/66*   (2006.01)
*H02H 7/06*   (2006.01)
*H05B 37/02*  (2006.01)

(52) U.S. Cl. .................. 341/147; 341/144; 322/27; 322/25; 315/209 R; 315/247

(58) Field of Classification Search ............ None
See application file for complete search history.

(56) References Cited

U.S. PATENT DOCUMENTS 5,760,623 A * 6/1998 Hastings .................. 327/137
2004/0049749 A1 * 3/2004 Croix ....................... 716/4

* cited by examiner

*Primary Examiner*—Tuyet Thi Vo

(57) ABSTRACT

Generation of segmented sawtooth waveforms. A desired waveform is divided into intervals. A slope is associated with each interval. A charge current representing the slope is applied to a timing capacitor during each interval. Responsive to a clock signal, a counter chain indexes a digital memory which provides values to a digital to analog converter. The output of the digital to analog converter drives an adjustable current source to charge the timing capacitor.

8 Claims, 4 Drawing Sheets

SEGMENTED SAWTOOTH GENERATOR

TECHNICAL FIELD

Embodiments in accordance with the invention relate generally to the generation of sawtooth waveforms and more particularly to the generation of segmented sawtooth waveforms.

BACKGROUND

Sawtooth waveforms, such as shown in FIG. 1, are used in a variety of electronic applications. They are used, for example, as sweep signals in cathode-ray television displays. A sawtooth waveform may also be combined with another waveform using a comparator to generate a pulse-width-modulated (PWM) representation of a waveform.

A simple sawtooth generator, as known to the art, comprises a constant current source, a capacitor, and a threshold detector. The constant current source charges the capacitor until a threshold voltage is reached, at which time the capacitor is discharged.

The traditional goal of such a generator is to provide a monotonic, linear ramp.

However, there may be circumstances where nonlinearities are desired. As an example, nonlinearities in a sawtooth waveform may be desired to compensate for nonlinearities in other parts of a system.

FIG. 2 shows an example nonlinear sawtooth waveform. While the waveform is monotonic, the slopes of segments 1, 2, 3, 4, and 5 are different.

One approach to generating such a waveform is by using an arbitrary waveform generator, shown in simplified form in FIG. 3. A clock drives a counter which indexes a memory device. The contents of the memory device representing waveform samples are fed to a digital to analog converter (D/A) which generates the waveform.

A substantial amount of circuitry is required to implement such an arbitrary waveform generator. Referring again to FIGS. 1 and 2, assume that an end-resolution of one part in 4096 (1 in 2^12, 12 bits) is desired.

To generate the waveform of FIG. 1, a D/A with 12-bit resolution is adequate.

For the waveform of FIG. 2, analysis shows that the D/A resolution is determined by the total span divided by the lowest slope. In FIG. 2, segment 2 has the lowest slope. If, for example, this segment has ¼ the slope of the linear waveform of FIG. 1, the D/A converter required for FIG. 2 must have 4 times the resolution, a 14-bit converter resolving 1 part in 16384. Not only is a 14-bit D/A converter more expensive than a 12-bit converter, a 14 bit wide memory is now required. Overall circuit layout and implementation is also more critical in order to keep circuit noise levels low enough so that one part in 16384 may be resolved accurately and reliably.

SUMMARY

In accordance with the invention, a segmented sawtooth generator is provided. A digital to analog converter drives a adjustable current source used to charge the timing capacitor in a sawtooth generator. A counter chain responsive to a clock provides addresses to a digital memory. The selected contents of the digital memory provide inputs to the D/A converter. The digital memory and D/A converter need only resolve the required number of different slopes needed to produce the segmented waveform. The D/A converter need not be linear. The clock may be prescaled, reducing the memory required.

BRIEF DESCRIPTION OF THE DRAWINGS

The invention will best be understood by reference to the following detailed description of embodiments in accordance with the invention when read in conjunction with the accompanying drawings, wherein.

DETAILED DESCRIPTION

The invention relates to segmented sawtooth generators. The following description is presented to enable one skilled in the art to make and use the invention, and is provided in the context of a patent application and its requirements. Various modifications to the disclosed embodiments will be readily apparent to those skilled in the art, and the generic principles herein may be applied to other embodiments. Thus, the invention is not intended to be limited to the embodiments show but is to be accorded the widest scope consistent with the appended claims and with the principles and features described herein.

Figure 1:
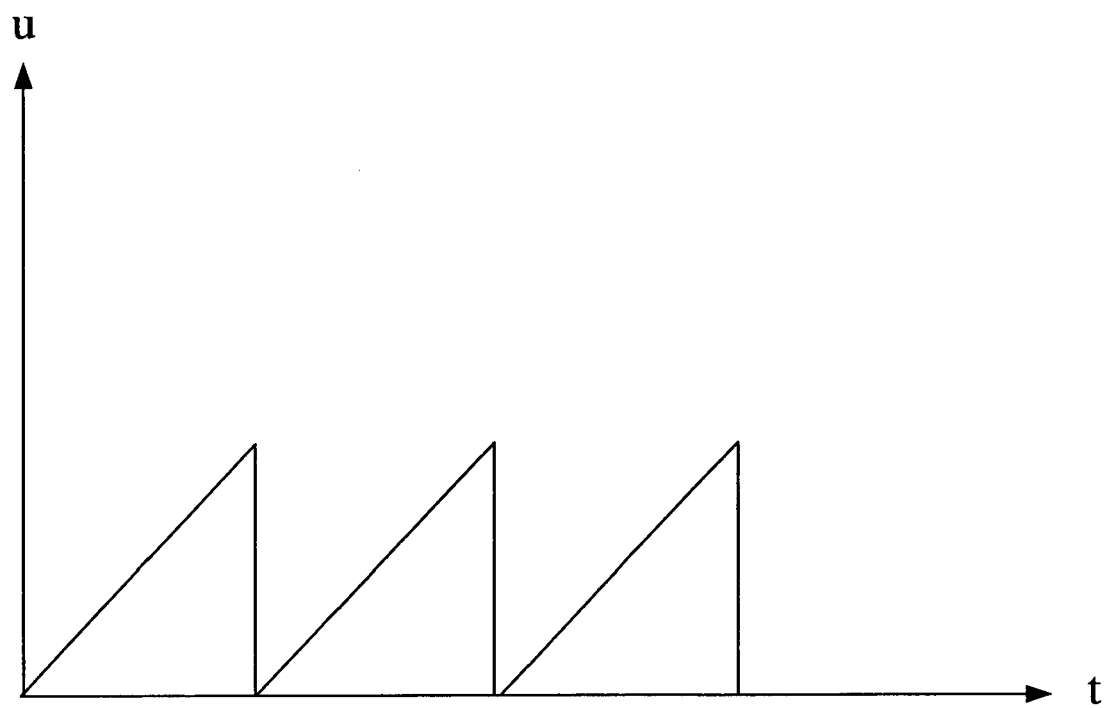
FIG. 1 shows a standard sawtooth waveform.

With reference now to the figures and in particular with reference to FIG. 1, a standard sawtooth waveform is shown. Ideally, the waveform increases monotonically and linearly from a starting point to an ending point, and rapidly returns to the starting point.

Figure 2:
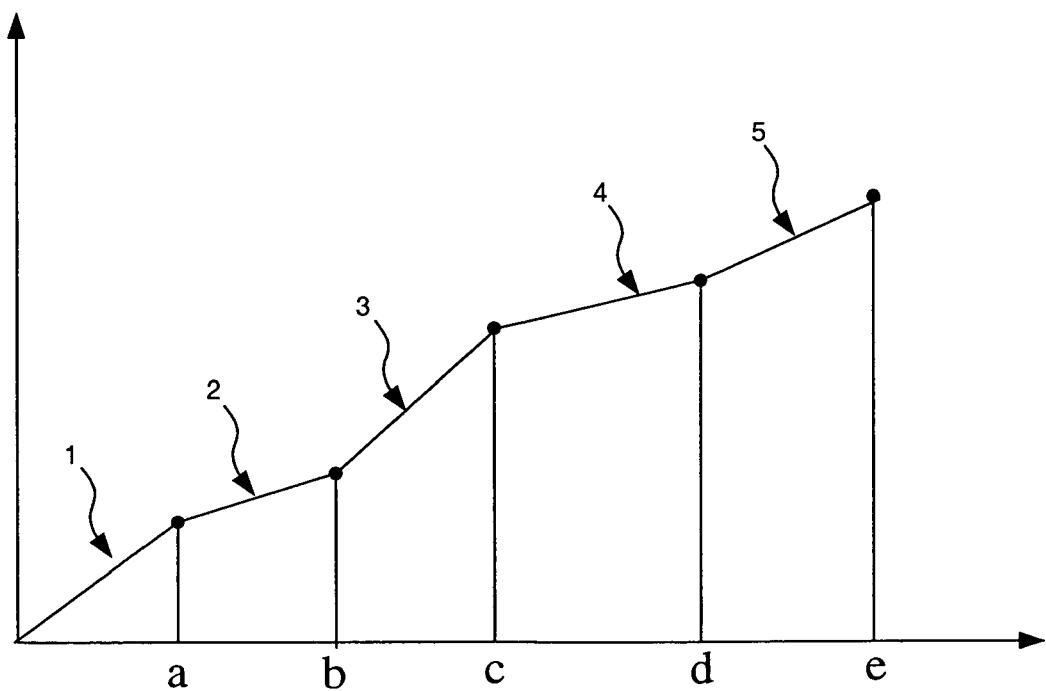
FIG. 2 shows a segmented sawtooth waveform.

FIG. 2 shows a segmented sawtooth waveform having 5 segments of differing slopes. Generating a sawtooth waveform with a resolution of 1 part in 4096 (12 bit resolution) in both time and voltage, requires a 12 bit counter, a 4096 by 12-bit memory, and a 12 bit D/A converter. The D/A needs to be monotonic and glitch-free.

Figure 3:
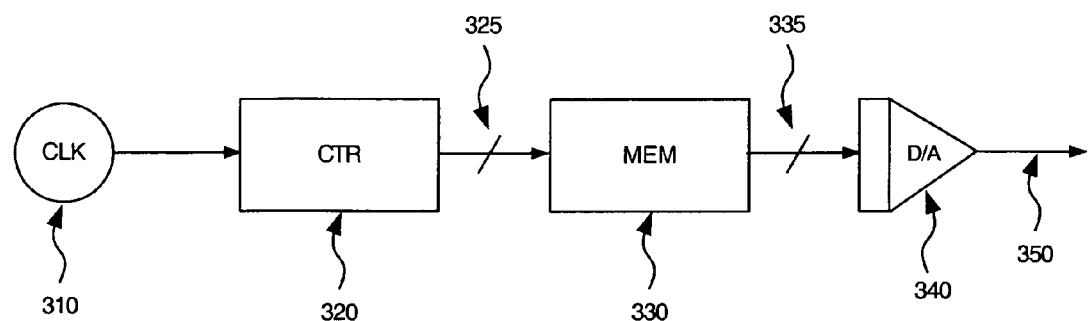
FIG. 3 shows an arbitrary waveform generator as known to the art.

FIG. 3 is a block diagram of arbitrary waveform generator as known to the art. Clock 310 provides input to counter chain 320. The output 325 of counter chain 320 is used to address memory 330, which may be RAM (writeable memory), ROM, or other suitable memory. This address data is typically presented in parallel to the memory device. As counter chain 320 generates successive memory addresses 325 for memory 330, the contents 335 of these memory addresses are sent to digital-to-analog (D/A) converter 340, which produces analog output signal 350. The successive memory locations of memory 330 contain the sequential time series values of the waveform to be generated.

This type of generator may be used to produce sawtooth waveforms. While such a generator may be used to generate the waveform of FIG. 2, the D/A resolution required is determined by the lowest slope, which is segment 2 in FIG. 2. In this example, a 14-bit D/A converter may be required to adequately resolve the waveform. Thus, a 12 bit counter is needed, a 4096 by 14 bit memory, and a 14 bit D/A.

Figure 4:
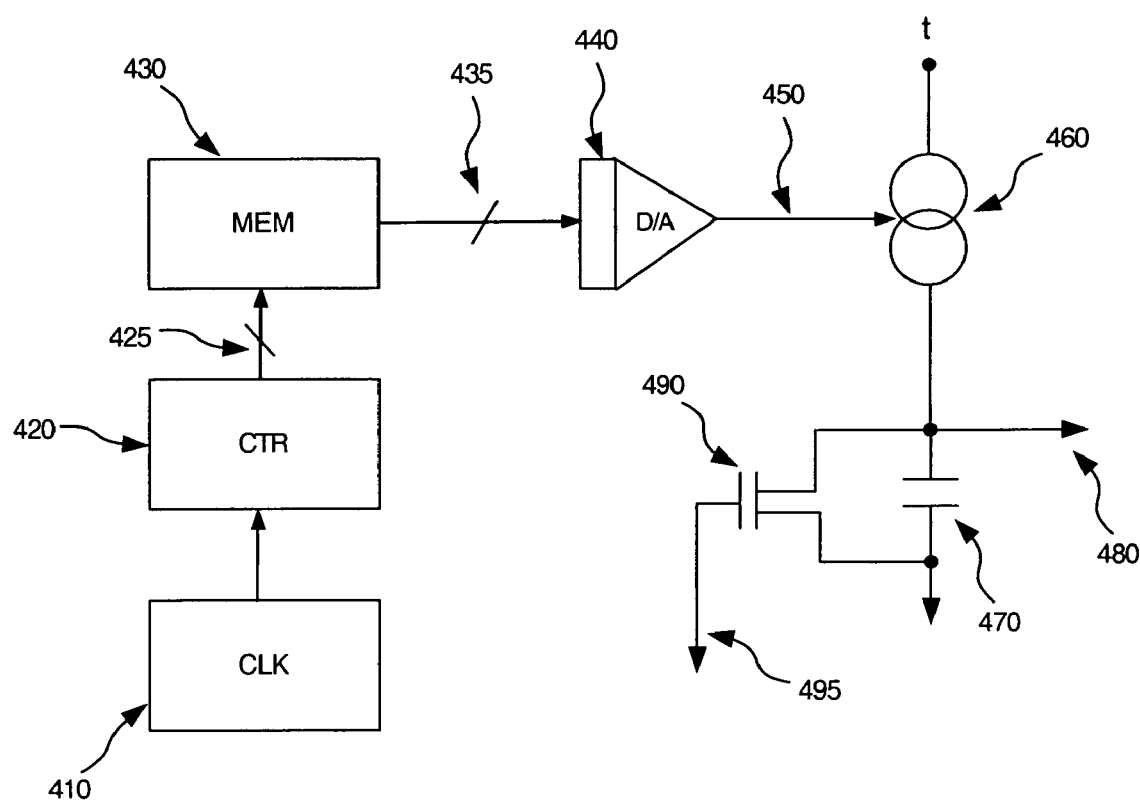
FIG. 4 shows a segmented sawtooth generator.

An embodiment of the present invention is shown in FIG. 4. The desired waveform is divided into intervals. A slope is associated with each interval. These slope values represent charge currents used to charge a timing capacitor. Clock 410 provides input to counter chain 420. Counter chain 420 provides address data 425 to memory 430. The addressed contents of memory 430 are presented 435 to digital to analog converter 440, producing analog output 450. This analog output is used to control adjustable current source 460. Adjustable current source 460 charges timing capacitor 470, producing sawtooth output 480. Switch 490 provides one means of resetting the sawtooth output using reset line 495. Other means known to the art may also be used. Reset logic form the counter chain is not shown for clarity.

Adjustable current sources are known to the art. One embodiment is the Howland current source, shown in *The Art of Electronics* by Horowitz and Hill, 2nd Edition, page 182. Other more suitable approaches are illustrated by components such as the LM 134/224/334 series of adjustable current sources produced by companies such as National Semiconductor, Linear Technology, SGS-Thompson Microelectronics, and others. Other embodiments will be apparent to those familiar with the art.

The output of counter 420 selects a particular location in memory 430. The contents of the memory (which may be read-only, programmable, or read write RAM, for example) represent the slope to be generated and are fed to D/A converter 440. The output of the D/A converter controls current source 460, resulting in timing capacitor 470 being charged at the slope desired.

Referring again to FIG. 2, as counter 420 goes from time 0 to time a, a sequential set of memory locations are accessed, each of them containing the slope value for segment 1. As the counter goes from time a to time b, a subsequent set of memory locations are accessed, each of them containing the slope value for segment 2. This process continues through the range of the counter, and over all specified segments.

According to the invention, memory 430 and D/A converter 440 now need only resolve the number of different slopes required for the different segments. In the example shown in FIG. 2, 5 segments are present. A 3-bit wide memory is all that is required (and would select up to 8 segments).

The D/A converter required in the invention also only has to resolve the different slopes. In the example given, the D/A may be a simple resistor ladder if the D/A outputs are known in advance. This ladder may be integrated into the adjustable current source. If a more general solution is needed, such as in the case where the waveform segments are determined and programmed into a system as part of an overall calibration step, an 8-bit memory and an 8-bit D/A converter may be used. Such a combination would provide up to 256 different slope values.

Examining the operation of the segmented sawtooth waveform generator in FIG. 4 with respect to the wave form of FIG. 2 shows that the charging current to timing capacitor 470 is only changed a small number of times. Memory 430 will therefore contain long runs of duplicate entries, changing only a small number of times.

Figure 5:
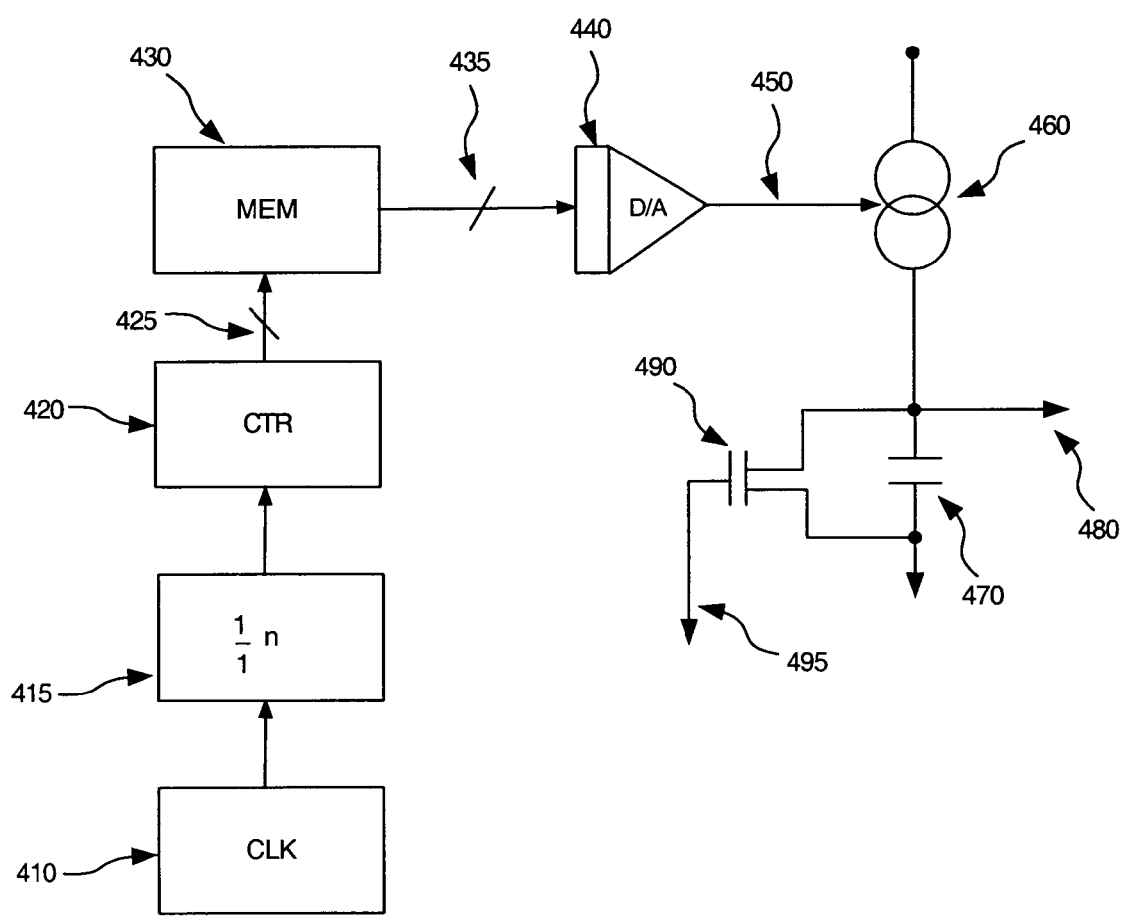
FIG. 5 shows a segmented sawtooth generator with prescaling.

FIG. 5 shows a second embodiment of the invention which reduces the size required for memory 430 by prescaling 415 clock 410. As an example, if prescaler 415 divides clock 410 by 16, the size of counter chain 420 and memory 430 are reduced accordingly. Such prescaling has the effect of reducing a 12-bit counter and a 4096 (2^12) entry memory to an 8-bit counter and a 256 (2^8) entry memory.

While powers of 2 (2, 4, 8, 16, etc.) are common prescaling values, values other than powers of two may also be used.

The selection of prescaling value will be application specific, depending on allowable deviation from an optimal waveform.

The foregoing detailed description of the present invention is provided for the purpose of illustration and is not intended to be exhaustive or to limit the invention to the precise embodiments disclosed. Accordingly the scope of the present invention is defined by the appended claims.

What is claimed is:

1. A method of generating a segmented sawtooth waveform comprising:
    dividing the segmented sawtooth waveform into intervals;
    associating a slope with each interval of the segmented sawtooth waveform;
    consecutively storing a single value representative of the slope of each interval of the segmented sawtooth waveform to generate a series of stored values;
    consecutively retrieving the series of stored values;
    using a digital-to-analog converter to adjust a current source over time based on the series of stored values; and
    charging a timing capacitor from the current source.

2. The method of claim 1 where the retrieved series of stored values are selected by a clock.

3. The method of claim 1 where the retrieved series of stored values are selected by a prescaled clock.

4. A segmented sawtooth generator comprising:
    a counter responsive to a clock, the counter producing a multiple-channel counter output;
    a memory containing stored values representing slopes of a desired segmented sawtooth waveform the memory responsive to the multiple-channel counter output and generating a multiple-channel memory output;
    a digital-to-analog converter having a multiple-channel input coupled to the multiple-channel memory output and configured to produce an output signal representative of a slope responsive to a current segment of the desired segmented sawtooth waveform;
    an adjustable current source controlled by the digital-to-analog converter output signal; and
    a timing capacitor charged by the adjustable current source.

5. The segmented sawtooth generator of claim 4 where the counter responds directly to the clock.

6. The segmented sawtooth generator of claim 4 where the counter responds to a prescaler coupled in series between the clock and the counter.

7. The segmented sawtooth generator of claim 4 further comprising:
    a means for resetting the segmented sawtooth generator.

8. The segmented sawtooth generator of claim 7 where the means for resetting the segmented sawtooth generator is responsive to a periodic input signal.

* * * * *

UNITED STATES PATENT AND TRADEMARK OFFICE
CERTIFICATE OF CORRECTION

| | | |
|---|---|---|
| PATENT NO. | : 7,126,520 B2 | Page 1 of 1 |
| APPLICATION NO. | : 10/769270 | |
| DATED | : October 24, 2006 | |
| INVENTOR(S) | : Robert T. Martin | |

It is certified that error appears in the above-identified patent and that said Letters Patent is hereby corrected as shown below:

Column 4, Line 37, Claim 4, delete "waveform" and insert -- waveform, --.

Signed and Sealed this

Ninth Day of November, 2010

David J. Kappos
*Director of the United States Patent and Trademark Office*